(12) United States Patent
Arima et al.

(10) Patent No.: US 6,300,224 B1
(45) Date of Patent: Oct. 9, 2001

(54) METHODS OF DICING SEMICONDUCTOR WAFER INTO CHIPS, AND STRUCTURE OF GROOVE FORMED IN DICING AREA

(75) Inventors: Takahisa Arima; Yukihisa Kusuda, both of Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 09/806,262
(22) PCT Filed: Jul. 25, 2000
(86) PCT No.: PCT/JP00/04939
§ 371 Date: Mar. 28, 2001
§ 102(e) Date: Mar. 28, 2001
(87) PCT Pub. No.: WO01/09932
PCT Pub. Date: Feb. 8, 2001

(30) Foreign Application Priority Data

Jul. 30, 1999 (JP) .................................................. 11-216679
Aug. 12, 1999 (JP) .................................................. 11-228279

(51) Int. Cl.[7] .......................... H01L 21/46; H01L 21/78; H01L 21/301
(52) U.S. Cl. .......................... 438/462; 438/460; 438/465; 438/8; 438/14; 438/16; 257/48; 257/797
(58) Field of Search .................................... 438/460, 462, 438/465, 16, 148; 257/797, 48

(56) References Cited

U.S. PATENT DOCUMENTS 4,217,689 * 8/1980 Fujii et al. ............................. 29/583

FOREIGN PATENT DOCUMENTS

| 57-76860 | 5/1982 | (JP) . |
| 6-112312 | 4/1994 | (JP) . |
| 6-232254 | 8/1994 | (JP) . |
| 6-236447 | 8/1994 | (JP) . |
| 6-275713 | 9/1994 | (JP) . |

* cited by examiner

Primary Examiner—John F. Niebling
Assistant Examiner—David A Zarneke
(74) Attorney, Agent, or Firm—Ratner & Prestia (57) ABSTRACT

A method for dicing a semiconductor wafer into chips is provided, in which the peeling-off of a hard protective film on the surface of a semiconductor substrate may be avoided. Two parallel grooves are formed at a dicing area around a chip by an etching process. Then, $SiO_2$ film is deposited on the GaAs substrate as a protective film. At this time, a bending portion at the interface between the protective films on the inner surface of the groove and the surface of the substrate. When the part between two grooves is cut by a dicing blade, a stress to the protective film caused by the edge of the blade is concentrated to the bending portion, resulting in a crack along the bending portion.

15 Claims, 10 Drawing Sheets

METHODS OF DICING SEMICONDUCTOR WAFER INTO CHIPS, AND STRUCTURE OF GROOVE FORMED IN DICING AREA

TECHNICAL FIELD

The present invention relates to a method for dicing a semiconductor wafer into chips, particularly to a method for dicing a semiconductor wafer provided with grooves in dicing areas. The present invention further relates to the structure of such grooves.

BACKGROUND ART

When a semiconductor wafer (or a semiconductor substrate) on which semiconductor elements are built in is diced into chips, if the surface of the semiconductor wafer is covered by an electrically insulating hard protective film such as oxide film and nitride film, the peeling-off of the protective film is caused in the edge part of a cut line.

Figure 1:
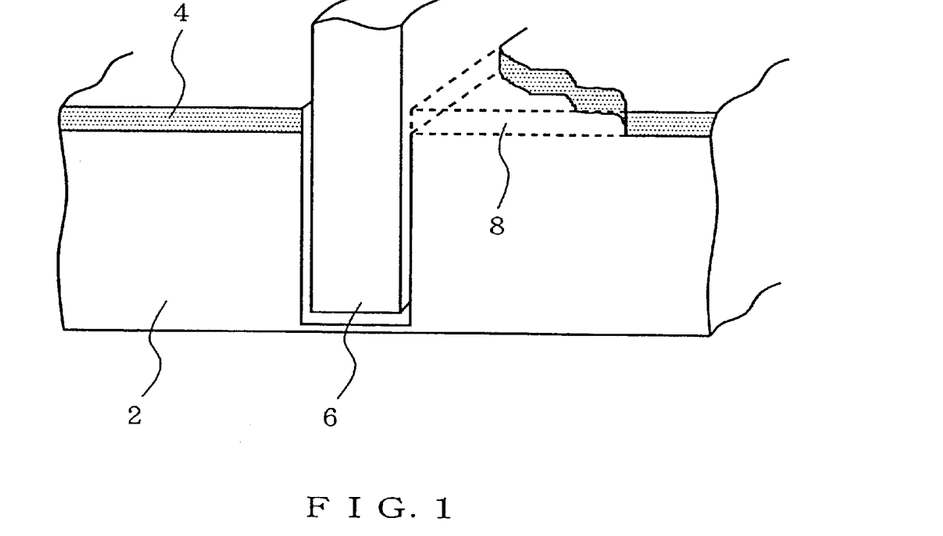
FIG. 1 is a diagram illustrating the peeling-off of a surface protective film during a dicing step.

With reference to FIG. 1, the protective film 4 provided on the substrate 2 is peeled off during a dicing step by a blade 6. A reference numeral 8 denotes a part of the film peeled off.

Figure 2:
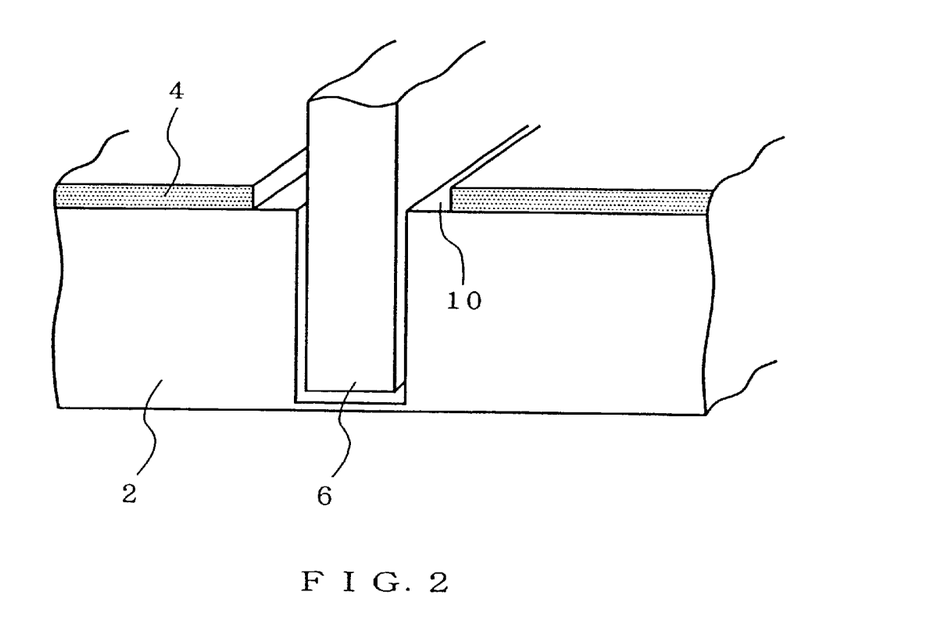
FIG. 2 is a diagram illustrating an example of a conventional dicing method.

In order to prevent the peeling-off of the protective film conventionally, a dicing step is conducted after the protective film is etched away along a dicing line as shown in FIG. 2, reference numeral 10 denoting the part of the protective film etched away.

According to the conventional dicing method in FIG. 2, the step for etching away the protective film is needed to be conducted other than the step for fabricating semiconductor elements, resulting in the problems of the increase of manufacturing steps and cost.

Figure 3:
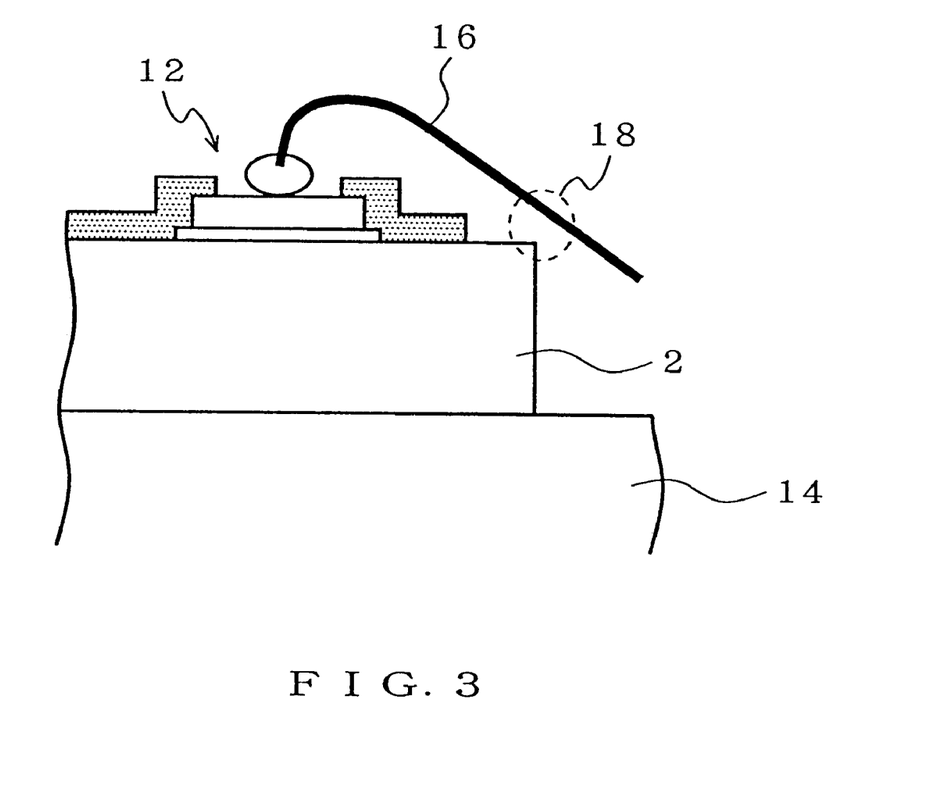
FIG. 3 is a diagram illustrating an electrical short between a semiconductor substrate and a lead wire.

When the semiconductor wafer is diced after the protective film is peeled off along dicing lines, the substrate is laid bare in the edge part of each diced chip. Accordingly, in the case where a semiconductor element 12 is mounted on a printed circuit board 14 and the element 12 is connected to the board 14 through a lead wire 16 as shown in FIG. 3, there is a possibility that the substrate 12 and the wire 16 are electrically shorted around the position 18, resulting in the malfunction of the semiconductor element 12.

DISCLOSURE OF INVENTION

An object of the present invention is to provide a method for dicing a semiconductor wafer which is covered by an electrically insulating hard protective film such as oxide film or nitride film to protect the surface of the wafer.

Another object of the present invention is to provide a structure of grooves formed in dicing areas of the wafer.

Still another object of the present invention is to provide a structure of grooves for preventing the displacement of the dicing position from being caused during a dicing step by an full automatic dicing apparatus.

A further object of the present invention is to provide a method for detecting the edge of each cut line accurately.

According to the present invention, grooves are formed in dicing area around each chip by utilizing etching steps during the fabrication of semiconductor elements. Then, a hard protective film is deposited on the inner surface the groove and the surface of the substrate. An edge of a dicing blade is aligned in such a manner that the edge passes through the bottom of the groove. A stress is applied upward or downward to the portion of the protective film to which the edge of the dicing blade is contacted. This stress is propagated from the protective film on the groove to the protective film on the substrate. At this time, the stress is concentrated to the bending portion at the interface between the protective films on the inner surface of the groove and the surface of the substrate, so that the crack is caused along the bending portion. The bending portion where such stress is caused is herein referred to as a crack caused portion.

In order to cause such crack, it is required that the radius of the bending portion is substantially smaller than the thickness of the protective film. For example, if the radius of the bending portion is one-half the thickness of the protective film, a bending stress caused at the bending portion having a bending angle of 0°–120° is 1.5 times that caused at another part of the film. Also, if the radius of the bending portion is one-tenth the thickness of the protective film, the pending stress caused at the pending portion is increased by 2.5 times that of a peripheral part of the film. If the radius of the bending portion is one-twentieth the thickness of the protective film, the bending stress is increased by 3.4 times that of a peripheral part of the film. While an acute angle is preferable for a bending angle of the bending portion, the angle of 90° is comparable to an acute angle.

As a protective film is disrupted by a crack caused at the bending portion, the stress caused by the edge of the blade is not propagated to the area of a semiconductor element. Therefore, the peeling-off of the protective film is not caused at the area of a semiconductor element.

The width of a groove is preferably about 1–20 $\mu$m. While a groove is preferably formed at both-side edges of a dicing line, respectively, a groove may be formed only at one-side edge of a dicing line in the case where only the area neighboring said one-side edge is required to be protected by the film. Alternatively, only one groove which has a width larger than the that of a dicing line may be formed in place of providing groove in both-side edges of a dicing line, respectively.

When one or more etching steps are conducted in the fabricating process of semiconductor elements, an additional groove may be formed in the bottom of an already provided groove to increase the number of crack caused portions. In this case, if a stress has been propagated through a first crack caused portion, the propagation of the stress may be blocked at a second crack caused portion. As a result, the peeling-off of the protective film at the area of a semiconductor element may necessarily be avoided.

Furthermore, according to the present invention, a groove non-formed part may be provided for grooves to be formed at a dicing area. An accurate position of the edge of a cut line may be detected at the groove non-formed part by means of a CCD camera. In this manner, the position of the edge of the cut line may be accurately recognized, so that a next dicing position estimated based on the accurate position of the edge of the cut line may also precisely recognized, i.e. an erroneous recognition for a dicing position is not caused. AS a result, a misregistration of a dicing position may be avoided.

In the present invention, a groove non-formed part is needed to be provided at one or more positions for one dicing line which is required to have a more accurate dicing position. In most cases, as a plurality of chips each having the same configuration are arranged repeatedly on a wafer, it is easy to provide only one groove non-formed part at the peripheral part of each chip. As a result, a groove non-formed part may be easily searched by a CCD camera after dicing.

Where the length of a groove non-formed part is too long, a chipping or a peeling-off of a protective film is caused, and where is too short, it becomes difficult to detect a accurate position of a cut line. When monitoring a groove non-formed part on a CRT with a magnification of 400, the length of a groove non-formed part is preferably about 10–100 μm.

Also, a dicing method of the present invention comprising the steps of: a) detecting an edge of a cut line after cutting a first dicing area of the semiconductor wafer by picking up an image of an area of the cut line including the groove non-formed part by an image pick-up device; b) correcting a next dicing position stored in the full automatic dicing apparatus based on the edge of the cut line detected; c) cutting a next dicing area based on the next dicing position corrected; d) detecting an edge of a cut line after cutting the next dicing area in the step c) by picking up an image of an area of the cut line including the groove non-formed part by an image pick-up device; e) correcting a further next dicing position stored in the full automatic dicing apparatus based on the edge of the cut line detected in the step d); f) cutting a further next dicing area based on the further next dicing position corrected in the step e); and g) repeating the steps d)–f).

It should be noted that the dicing method of the present invention is applicable to not only a semiconductor wafer provided with a protective film thereon but also a semiconductor wafer not provided with a protective film thereon.

BEST MODE FOR CARRYING OUT THE INVENTION

Figure 4A:
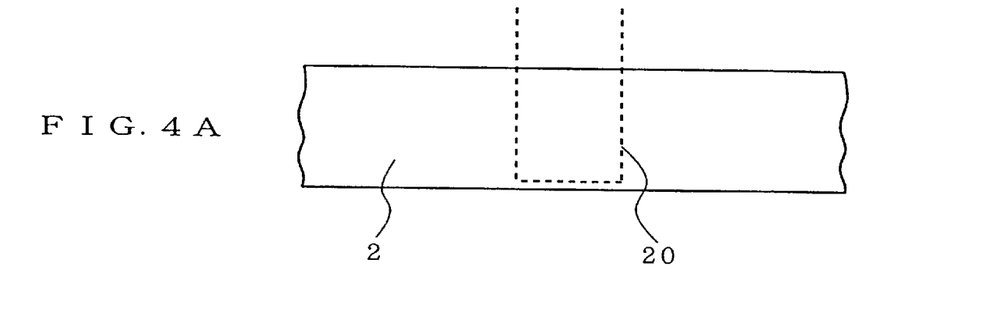
FIGS. 4A, 4B and 4C are cross sectional views for explanation of each step in a first embodiment.
Figure 4B:
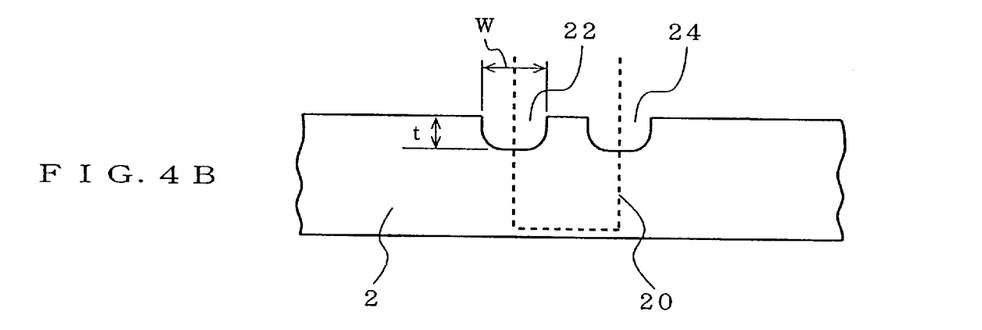
Figure 4C:
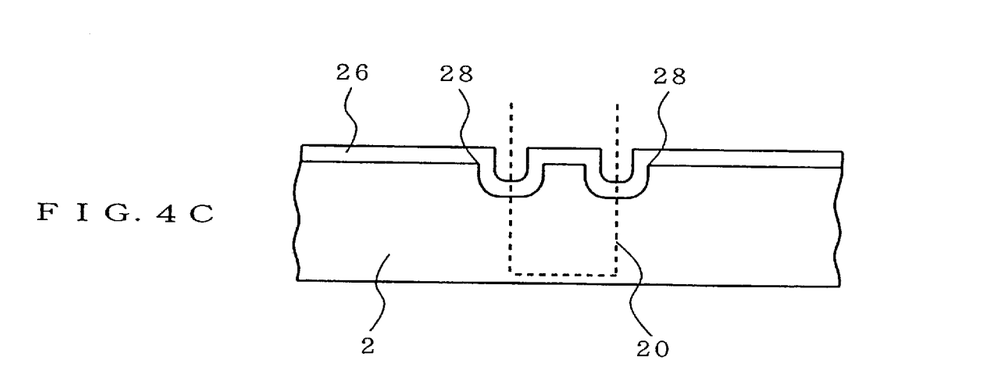

Embodiments of the present invention will now be described in detail with reference to the drawings. A first embodiment FIGS. 4A, 4B and 4C are cross sectional views for illustrating each step of a first embodiment. In general, the fabrication process of semiconductor elements includes etching processes. Utilizing an etching process, for a dicing area 20 in a semiconductor substrate 2 of GaAs having 300 μm thickness as shown in FIG. 4A, two parallel grooves 22 and 24 each having 10 μm width and 0.7 μm depth are formed by an etching process as shown in FIG. 4B. In FIG. 4B, "w" denotes the width and "t" the depth of each groove.

The distance between the centers of grooves 22 and 24 is the same as the thickness of a dicing blade (not shown), 25 μm for example.

Then, as shown in FIG. 4C, an $SiO_2$ film 26 of 0.4 μm thickness is deposited on the inner surface of the grooves 22, 24 and the surface of the semiconductor substrate 2 as a surface protective film. At this time, a bending portion (or a crack caused portion) 28 is formed at the interface between the inner surface of the groove and the surface of the substrate. As material for the surface protective film, SiN, $Al_2O_3$, $TiO_2$, $Ta_2O_5$ and the like may be used other than $SiO_2$.

Figure 5:
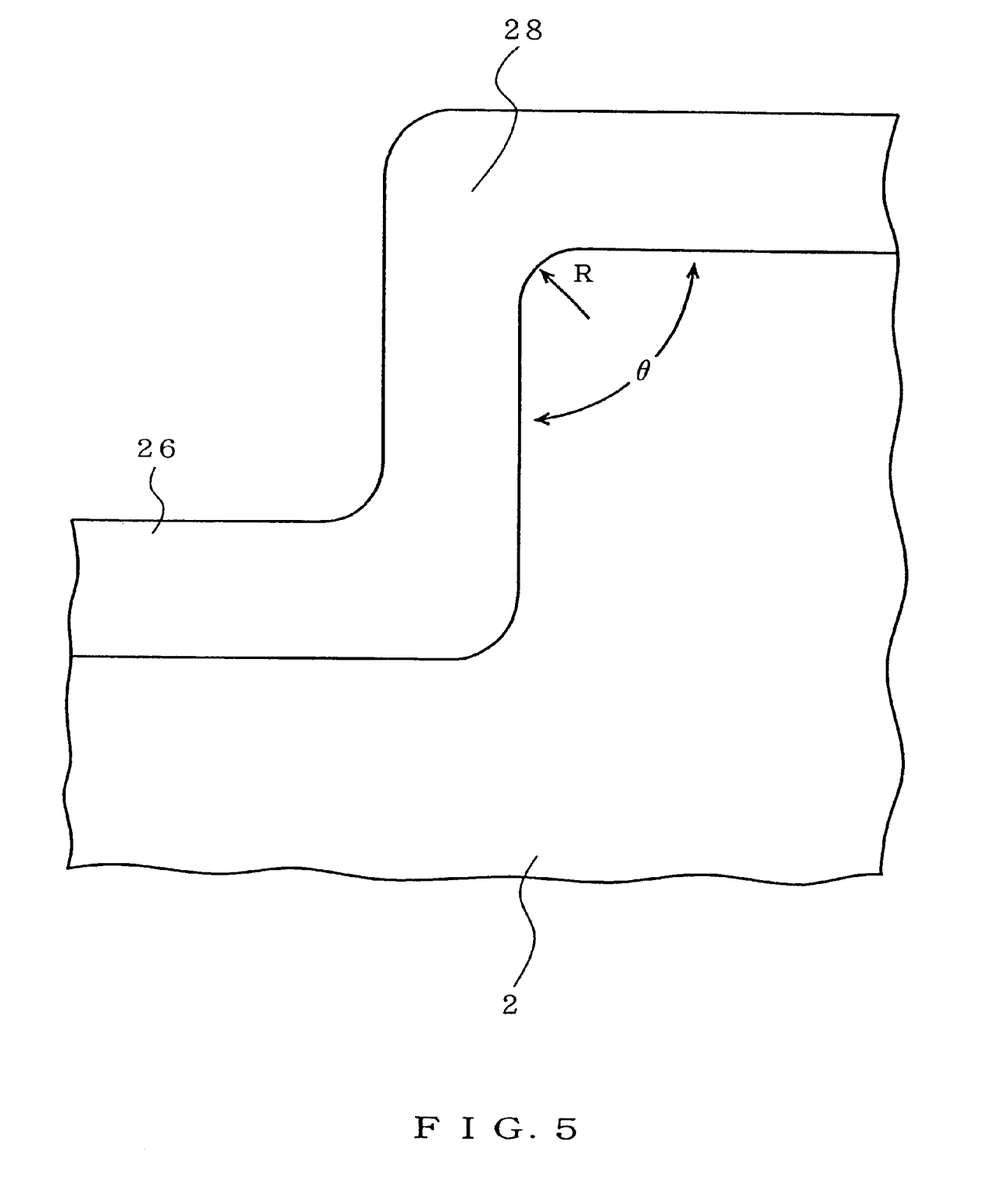
FIG. 5 is an expanded view of a bending portion.

FIG. 5 shows the bending portion 28 in expanded manner. The bending radius of the portion 28 is denoted by "R" and the bending angle "θ". In this embodiment, the thickness of the protective film 26 is two times or more the radius R of the bending portion 28, and θ is about 90°.

Figure 6A:
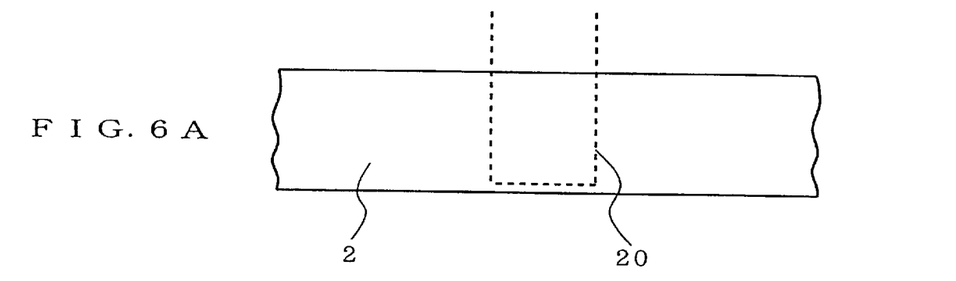
FIGS. 6A, 6B and 6C are cross sectional views for explanation of each step in a second embodiment.
Figure 6B:
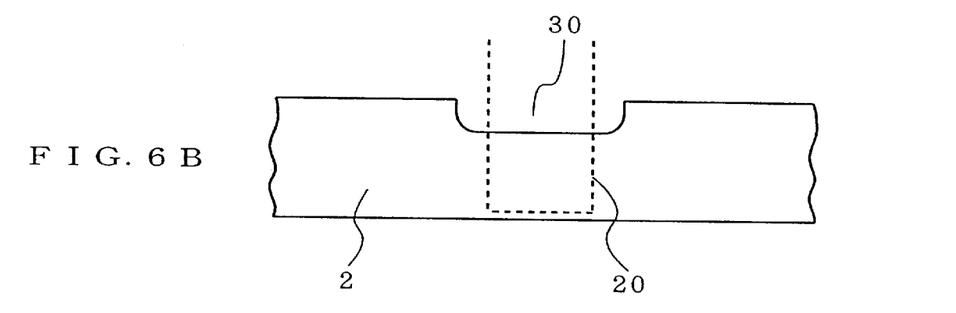
Figure 6C:
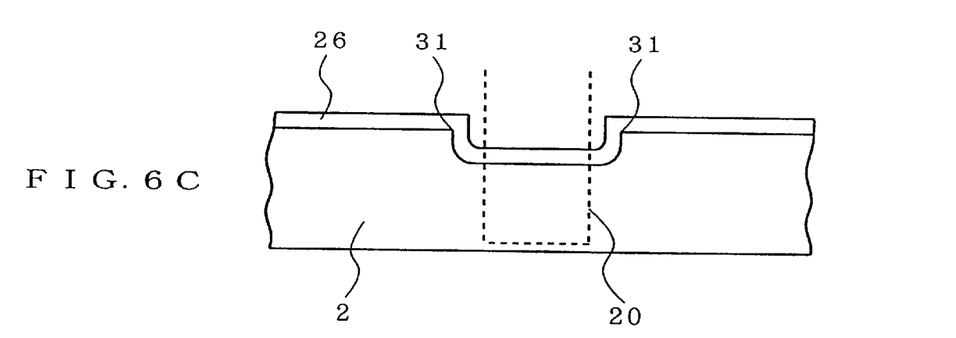

Using a dicing blade (not shown) of 25 μm thickness, the part between the two grooves 23 and 24 is diced to form a cut line. During a dicing step, the both-side edges of the dicing blade pass through the bottoms of the two grooves, respectively. At this time, a stress caused in the protective film 26 by the edges of the blade during a dicing step is concentrated to the bending portion 28, causing a crack along the bending portion. The protective film 26 is disrupted at the bending portion, so that the stress caused by the edges of a dicing blade is not propagated to the area of semiconductor elements. Therefore, the peeling-off of the protective film is not caused at the area of the semiconductor elements. A second embodiment FIGS. 6A, 6B and 6C are cross sectional views for illustrating each step of a second embodiment. For a dicing area 20 in a semiconductor substrate 2 of GaAs having 300 μm thickness as shown in FIG. 6A, one groove 30 having the width larger than the width (25 μm) of the dicing area is formed by an etching process as shown in FIG. 6B. The groove 30 has 35 μm width and 0.7 μm depth. Then, as shown in FIG. 6C, an $SiO_2$ film 26 of 0.4 μm thickness is deposited on the inner surface of the groove 30 and the surface of the semiconductor substrate 2 as a surface protective film.

Figure 7A:
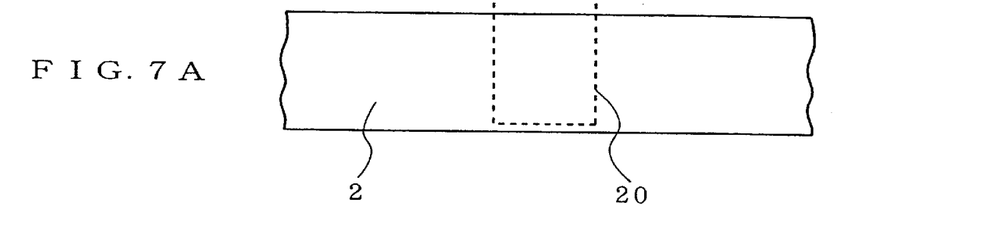
FIGS. 7A, 7B, 7C and 7D are cross sectional views for explanation of each step in a third embodiment.
Figure 7B:
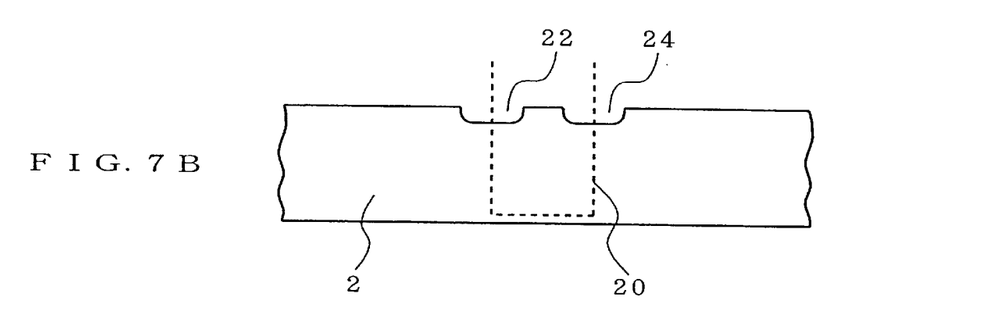
Figure 7C:
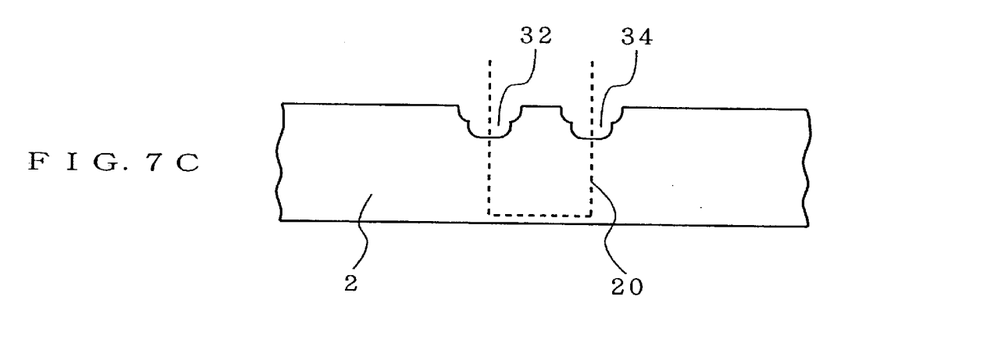

Using a dicing blade (not shown) of 25 μm thickness, the central part of the groove 30 is diced to form a cut line. During a dicing step, the both-side edges of the dicing blade pass through the bottom of one groove 30. At this time, a stress caused in the protective film 26 by the edges of the blade during a dicing step is concentrated to the bending portion 31 at the interface between the inner surface of the groove and the surface of the substrate, causing a crack along the bending portion. The protective film 26 is disrupted at the bending portion, so that the stress caused by the edges of a dicing blade is not propagated to the area of semiconductor elements. Therefore, the peeling-off of the protective film is not caused at the area of the semiconductor elements. A third embodiment FIGS. 7A, 7B and 7C are cross sectional views for illustrating each step of a third embodiment. According to this embodiment, for a dicing area 20 in a semiconductor substrate 2 of GaAs having 300 μm thickness as shown in FIG. 7A, two parallel first grooves 22 and 24 each having 10 μm width and 0.7 μm depth are formed as shown in FIG. 7B by an etching process in the same way as the first embodiment.

Additional second grooves each having 5 μm width and 1.3 μm depth are formed in the bottom of the first grooves 22 and 24, respectively, by an etching process in such a manner that the second groove is parallel to the first groove in which the second one is provided. Therefore, the configuration of each groove consisted of the first and second ones has two-step shape. The distance between the centers of two grooves each having two-step shape is 25 μm as in the first embodiment.

Figure 7D:
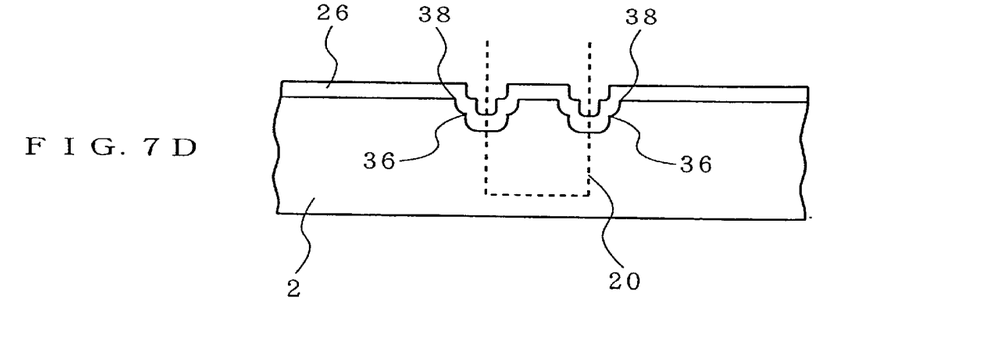

Then, as shown in FIG. 7D, an $SiO_2$ film 26 having 0.4 μm thickness is deposited on the inner surface of the grooves and the surface of the substrate as a surface protective film.

Using a dicing blade of 25 μm thickness, the part between the two grooves is diced to form a cut line. During a dicing step, the both-side edges of the dicing blade pass through the bottoms of the two grooves, respectively. In this case, the peeling-off of the protective film 26 is substantially prevented at the bending portion 36 between the first groove and the second groove. If the peeling-off of the protective film in part proceeds over the bending portion 36, the peeling-off will be completely stopped at the bending portion 38 between the inner surface of the first groove and the surface of the substrate and then will not be caused at the area of the semiconductor element.

In this manner, the propagation of the peeling-off of the protective film to the element area may be completely prevented by providing a plurality of crack caused portions. It is understood for those who skilled in the art that the method in this embodiment may be applicable to the second embodiment.

While three embodiment have described heretofore, the depth of each groove formed around a chip generally do not exceed the depth of the semiconductor element. This is because the grooves are formed by utilizing the etching step in the fabrication of semiconductor elements. The present invention, however, is useful for grooves each having a depth larger than that of the element area, these grooves being formed by a etching process other than the etching process during the fabrication step of the elements. A fourth embodiment A full automatic dicing apparatus is generally used for dicing a semiconductor wafer into chips. According to the full automatic dicing apparatus, the alignment of a wafer is carried out at first. This is automatically conducted by utilizing unique patterns on the wafer. Then, a dicing blade is moved to the position where a first dicing line seems to be in order to cut only one line. Then, a CCD camera is moved to the position where the cut line seems to be formed in order to search the cut line. The image of the cut line picked up by the CCD camera is darker than that of a peripheral part of the substrate, so that the cut line is recognized as "black" by processing the CCD image into binary.

Figure 8:
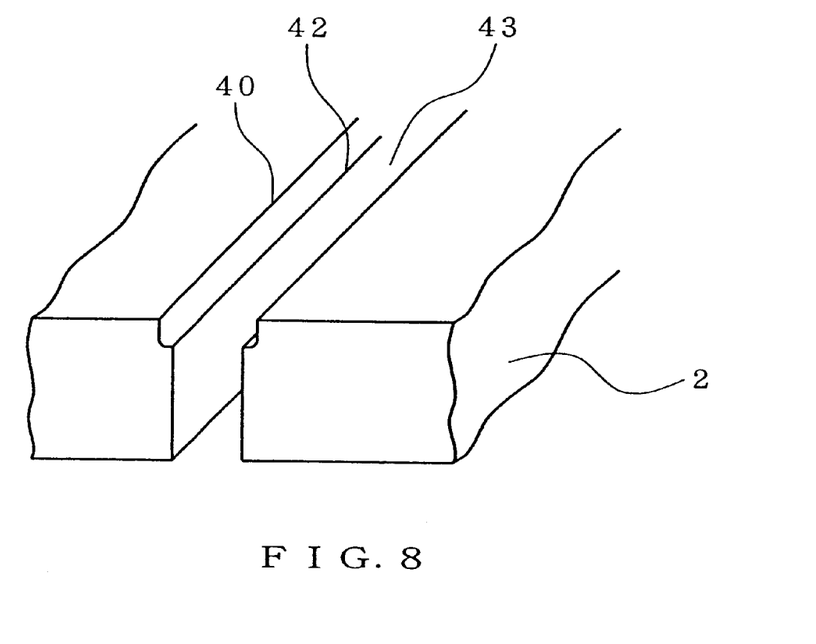
FIG. 8 is a diagram illustrating a dicing at a dicing area where grooves are formed.

FIG. 8 shows the substrate 2 after cutting, the substrate provided with grooves such as described in the first, second and third embodiments. In the figure, the edge 40 of the groove and the edge 42 of the cut line 43 are parallel each other.

It should be noted that the present embodiment is applicable to a semiconductor not having a protective film thereon, then a dicing step will be explained hereinafter for a wafer not provided with a protective film.

Returning to FIG. 8, monitoring these edges by a display (for example CRT) connected to the CCD camera, it is impossible to distinguish the edge 42 of the cut line 43 formed by a dicing step from the edge 40 of the groove formed by an etching step. That is, the edge 40 of the groove looks as "black" as the edge 42 of the cut line on the display. Therefore, the full automatic dicing apparatus erroneously recognizes the groove edges as the cut line edges. In such a case, an erroneous feedback is conducted in a next dicing, resulting in a displacement of a dicing position. Such displacements are accumulated until a cut line is correctly recognized, then the dicing position will have a large misregistration with respect to the target position.

In order to prevent such misregistration of the dicing position, a part at which grooves are not formed, i.e. a groove non-formed part is left without forming grooves across the overall length according to the present embodiment.

Figure 9:
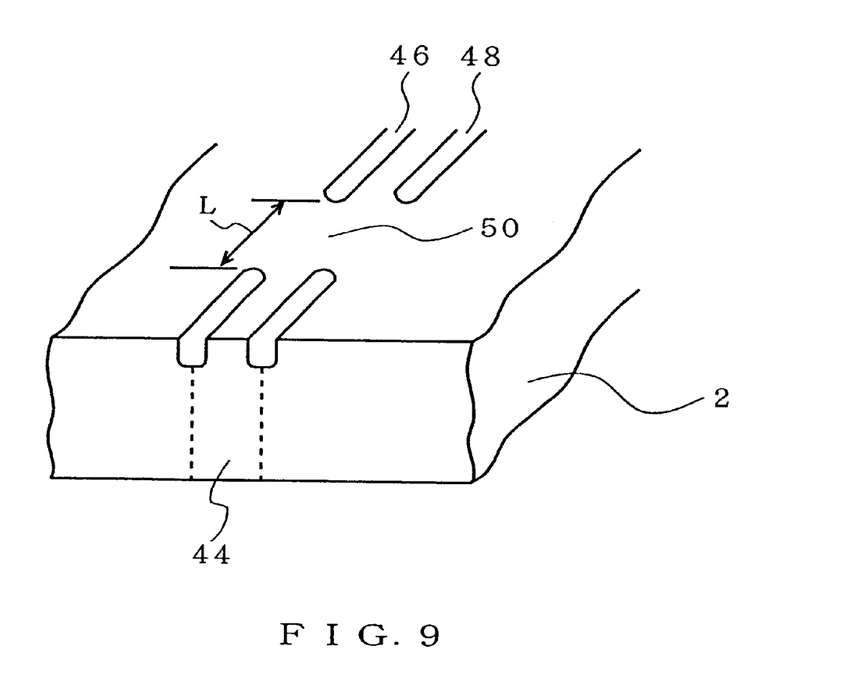
FIG. 9 is a diagram illustrating a structure of grooves formed at a dicing area.

FIG. 9 shows the structure of such grooves including non-formed part, the grooves being provided in a dicing area 44 in a semiconductor wafer 2 of 300 μm thickness which is diced by a blade of 25 μm thickness. Two grooves 46 and 48 each having 5 μm width and 2 μm depth are formed in parallel by an etching process. The distance between the centers of two grooves is 25 μm, and the distance between the outer edges of two grooves is 30 μm. A groove non-formed part 50 having the length "L" of 50 μm is left near a chip alignment mark or a unique pattern (not shown).

Figure 10:
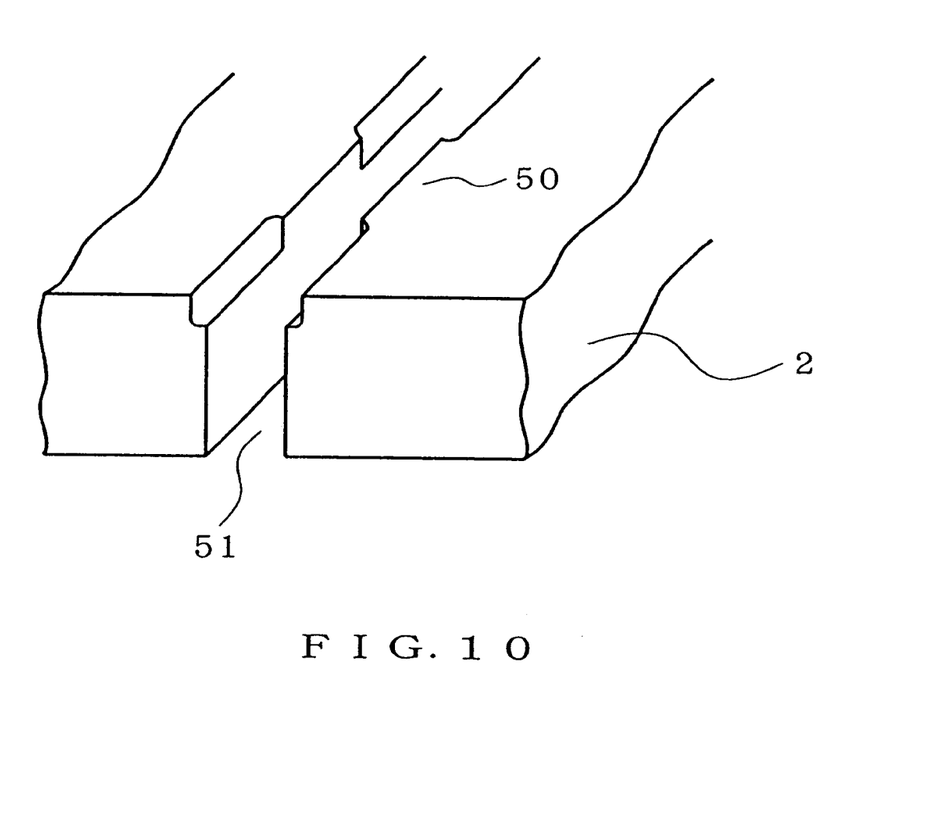
FIG. 10 is a diagram illustrating a dicing where the part between two parallel grooves shown in FIG. 9 is cut.

FIG. 10 shows the substrate 2 after cutting the part between two grooves 46 and 48 in the substrate shown in FIG. 9, the cut line being designated by reference numeral 51. When the cut line 51 is picked by a CCD camera and is monitored by a display (CRT) having a magnification of 400, the length "L" of the groove non-formed part 50 is 20 mm on the display. This shows that the length "L" is long enough to check the shape of the cut line 51 on the display.

Monitoring a groove formed area of the wafer 2 on the display, the width of "black" region is 12 mm, thereby it is recognized that the real width of "black" region on the wafer is 30 μm. This dimension (i.e. 30 μm) is recognized to be matched with the distance between the outer edges of the grooves 20 and 22. This dimension is also unchanged even if a dicing position is moved across 2.5 μm to the direction perpendicular to the longitudinal direction of grooves. This means that it is impossible to detect the edge of the cut line 51 accurately at the groove formed region.

In contrast to this, the width of the cut line 51 is recognized to be 10 mm on the display and 25 μm in real dimension at the groove non-formed part 50. This shows that the both-side edges of the cut line are inwardly apart by 2.5 μm from the outer edges of the grooves 46 and 48, respectively. Even if the dicing position deviates by 1 μm from the target position, the recognition of the edges of the cut line is enough possible. Based on the accurate position of the edges of the cut line, the dicing position may be corrected in the next dicing step.

Figure 11:
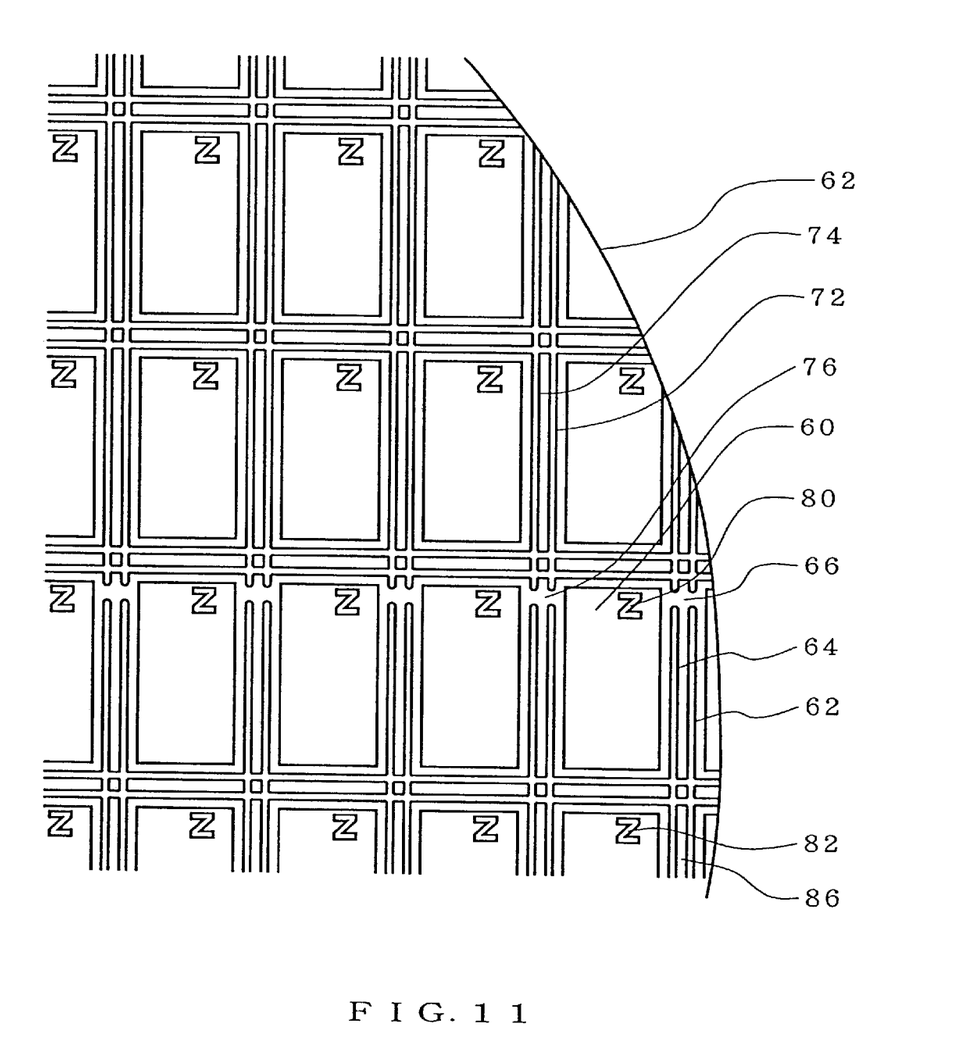
FIG. 11 is a partial plan view of a wafer having one groove non-formed portion per dicing area.

FIG. 11 shows a wafer 62 in which grooves of the present invention are formed around chips 60 to be diced. Two parallel grooves 62 and 64 formed at the peripheral area of the wafer 62 is provided with only one groove non-formed part 66. Two parallel grooves 72 and 74 formed at the inward area of the wafer 62 is also provided with only one groove non-formed part 76.

In a full automatic dicing apparatus, the positions of all the dicing areas are estimated by searching unique patterns 80 on chips. Based on this estimation, a dicing blade is moved to a dicing area where the grooves 62 and 64 are formed to cut only one line. Then, a CCD camera is moved to the position where a cut line is estimated to be in order to search the cut line. Furthermore, the position of a groove non-formed part 66 is estimated by the position of the unique pattern 80 and the groove non-formed part is picked up by a CCD camera. In the image picked up by the CCD camera, the cut line is necessarily darker than that of a peripheral part of the substrate. By processing the CCD image into binary, it is possible to recognize the portion of "black" as a cut line and the interface portion between "black" and "white" as the edge of the cut line. As shown in FIG. 10, the edge in the groove non-formed part 50 monitored by the CCD camera designates a correct cut line edge. Therefore, a correct cut line edge may be detected at the area of the groove non-formed part 66 in FIG. 11.

Based on the position of the cut line edge thus obtained, an estimated position of dicing area where the grooves 72 and 74 are formed is corrected and an area at the corrected position is then diced. And, the correct cut line edge is detected at the groove non-formed part 76 to correct a next dicing position. The same processing steps may be hereinafter repeated to dice a plurality of chips accurately from the wafer.

Figure 12:
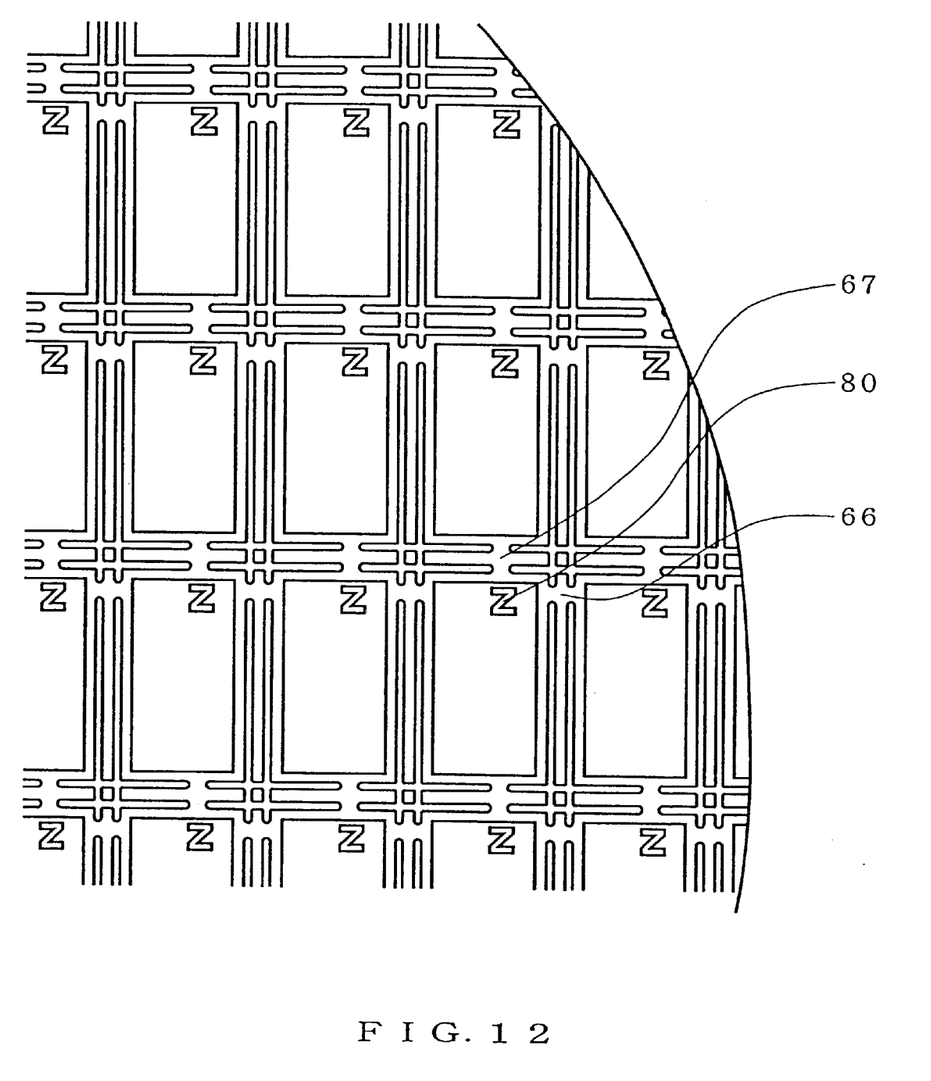
FIG. 12 is a partial plan view of a wafer having grooves non-formed portions provided for edges of all the chips.

In the case where only one groove non-formed part is provided for each dicing area, if the position of a wafer mounted to the full automatic dicing apparatus is deviated from the correct position, the unique pattern 82 may be recognized as the unique pattern 80, so that the groove non-formed part 66 may be erroneously decided to be at the position 86. In order to prevent such error, the groove non-formed parts 66 and 67 can be provided for all of chips, respectively, as shown in FIG. 12. In this manner, a groove non-formed part may easily be searched from any unique pattern 80 which is neighbored thereto.

Industrial Applicability

According to the present invention described above, a groove is formed at a dicing area to provide a surface protective film with a bending portion, so that the propagation of the peeling-off of the film toward an area of semiconductor elements is blocked. As this method is conducted by utilizing etching steps during the fabrication of the elements, the step of etching away the film in the conventional method is not needed. As a result, the number of steps is not increased in the present invention.

Furthermore, according to the present invention, the groove non-formed part is provided for grooves to be formed at a dicing area, so that the position of a cut line may be accurately detected. As a result, a misregistration of a dicing position is not caused in a full automatic dicing apparatus.

What is claimed is:

1. A method for dicing a semiconductor wafer into chips, comprising the steps of:
   forming at least one groove at a dicing area of a semiconductor substrate utilizing etching steps for the semiconductor substrate during the fabrication of semiconductor elements;
   depositing a hard protective film on the inner surface of the at least one groove and the surface of the substrate; and
   cutting the substrate by a dicing blade in such a manner that the edge of the dicing blade passes through the bottom of the at least one groove; and
   wherein a crack is caused at a bending portion at the interface between the protective films on the inner surface of the at least groove and the surface of the substrate during the cutting step.

2. The method of claim 1, wherein two parallel grooves are formed, and the both-side edges of the dicing blade pass through the bottoms of the two grooves, respectively.

3. The method of claim 1, wherein one groove is formed, and the one-side edge of the dicing blade pass through the bottom of the one groove.

4. The method of claim 1, wherein one groove is formed, and the both-side edges of the dicing blade pass through the bottom of the one groove.

5. A method for dicing a semiconductor wafer into chips, comprising the steps of:
   forming at least one first groove at a dicing area of a semiconductor substrate utilizing etching steps for the semiconductor substrate during the fabrication of semiconductor elements;
   forming one second groove at the bottom of the at least one first groove in parallel therewith utilizing etching steps for the semiconductor substrate during the fabrication of semiconductor elements;
   depositing a hard protective film on the inner surfaces of the first and second grooves and the surface of the substrate; and
   cutting the substrate in such a manner that the edge of a dicing blade passes through the bottom of the second groove; and
   wherein a crack is caused at a bending portion at the interface between the protective films at the interface between the protective films on the inner surfaces of the first and second grooves, or at the interface between the protective films on the inner surface of the first groove and the surface of the substrate during the cutting step.

6. The method of any one of claims 1–5, wherein the protective film is an electrical insulating material.

7. The method of any one of claims 1–5, wherein the protective film is $SiO_2$, SiN, $Al_2O_3$, $TiO_2$, or $Ta_2O_5$.

8. A structure of grooves formed at a dicing area for dicing a semiconductor wafer into chips, comprising:
   two parallel grooves including at least one groove non-formed part.

9. The structure of claim 8, wherein the two parallel grooves are formed by an etching process.

10. The structure of claim 9, wherein the length of the groove non-formed part in a longitudinal direction of the two grooves is 10–100 $\mu$m.

11. A semiconductor wafer comprising a structure of grooves of any one of claims 8–10.

12. The semiconductor wafer of claim 11, wherein the groove non-formed part is provided at least one position around each chip.

13. A method for detecting an edge of a cut line, comprising the steps of:
   cutting a semiconductor wafer of claim 11 to form a cut line by a dicing blade in such a manner that the both-side edges of the dicing blade pass through the bottoms of the two grooves, respectively;
   picking up an image of an area of the cut line including the groove non-formed part by an image pick-up device; and
   detecting an edge of the cut line from the image picked up by the image pick-up device.

14. The method of claim 13, wherein the image pick-up device is a CCD camera.

15. A method for dicing a semiconductor wafer of claim 11 into chips by a full automatic dicing apparatus, comprising the steps of:
   a) detecting an edge of a cut line after cutting a first dicing area of the semiconductor wafer by picking up an image of an area of the cut line including the groove non-formed part by an image pick-up device;
   b) correcting a next dicing position stored in the full automatic dicing apparatus based on the edge of the cut line detected;
   c) cutting a next dicing area based on the next dicing position corrected;
   d) detecting an edge of a cut line after cutting the next dicing area in the step c) by picking up an image of an area of the cut line including the groove non-formed part by an image pick-up device;

e) correcting a further next dicing position stored in the full automatic dicing apparatus based on the edge of the cut line detected in the step d);

f) cutting a further next dicing area based on the further next dicing position corrected in the step e); and g) repeating the steps d)–f).

* * * * *